(12) United States Patent
Cho

(10) Patent No.: US 8,923,051 B2
(45) Date of Patent: Dec. 30, 2014

(54) SEMICONDUCTOR MEMORY APPARATUS AND METHOD FOR DRIVING THE SAME

(75) Inventor: Ho Youb Cho, Ichon-shi (KR)

(73) Assignee: SK Hynix Inc., Gyeonggi-do (KR)

( * ) Notice: Subject to any disclaimer, the term of this patent is extended or adjusted under 35 U.S.C. 154(b) by 826 days.

(21) Appl. No.: 13/171,783

(22) Filed: Jun. 29, 2011

(65) Prior Publication Data

US 2012/0250431 A1    Oct. 4, 2012

(30) Foreign Application Priority Data

Mar. 30, 2011    (KR) .................. 10-2011-0028861

(51) Int. Cl.
G11C 7/20    (2006.01)
G11C 7/10    (2006.01)
G11C 16/06    (2006.01)
G11C 16/26    (2006.01)
G11C 16/10    (2006.01)

(52) U.S. Cl.
CPC .............. *G11C 7/1021* (2013.01); *G11C 7/20* (2013.01)
USPC ............ 365/185.08; 365/185.11; 365/185.21; 365/185.24; 365/189.05; 365/205; 365/238.5; 365/239

(58) Field of Classification Search
USPC ............ 365/185.08, 185.11, 185.17, 185.18, 365/185.19, 185.21, 185.24, 189.05, 205, 365/238.5, 239
See application file for complete search history.

(56) References Cited

U.S. PATENT DOCUMENTS

2009/0300311 A1* 12/2009 Lee ............................... 711/166

FOREIGN PATENT DOCUMENTS

KR    100560802         3/2006
KR    1020090122685 A   12/2009

* cited by examiner

*Primary Examiner* — J. H. Hur
(74) *Attorney, Agent, or Firm* — William Park & Associates Patent Ltd.

(57) ABSTRACT

A semiconductor memory apparatus includes: a memory block including first and second planes; and a reset signal generator configured to generate a first reset signal by logically combining a first plane selection signal and a control pulse signal which pulses after a first programming setup pulse signal pulses during a first programming command cycle, and generate a second reset signal by logically combining a second plane selection signal and the control pulse signal which again pulses after a second programming setup pulse signal pulses during a second programming command cycle after the first programming command cycle. A plurality of first page buffers allocated to the first plane are reset in response to the first reset signal, and a plurality of second page buffers allocated to the second plane are reset in response to the second reset signal.

16 Claims, 3 Drawing Sheets

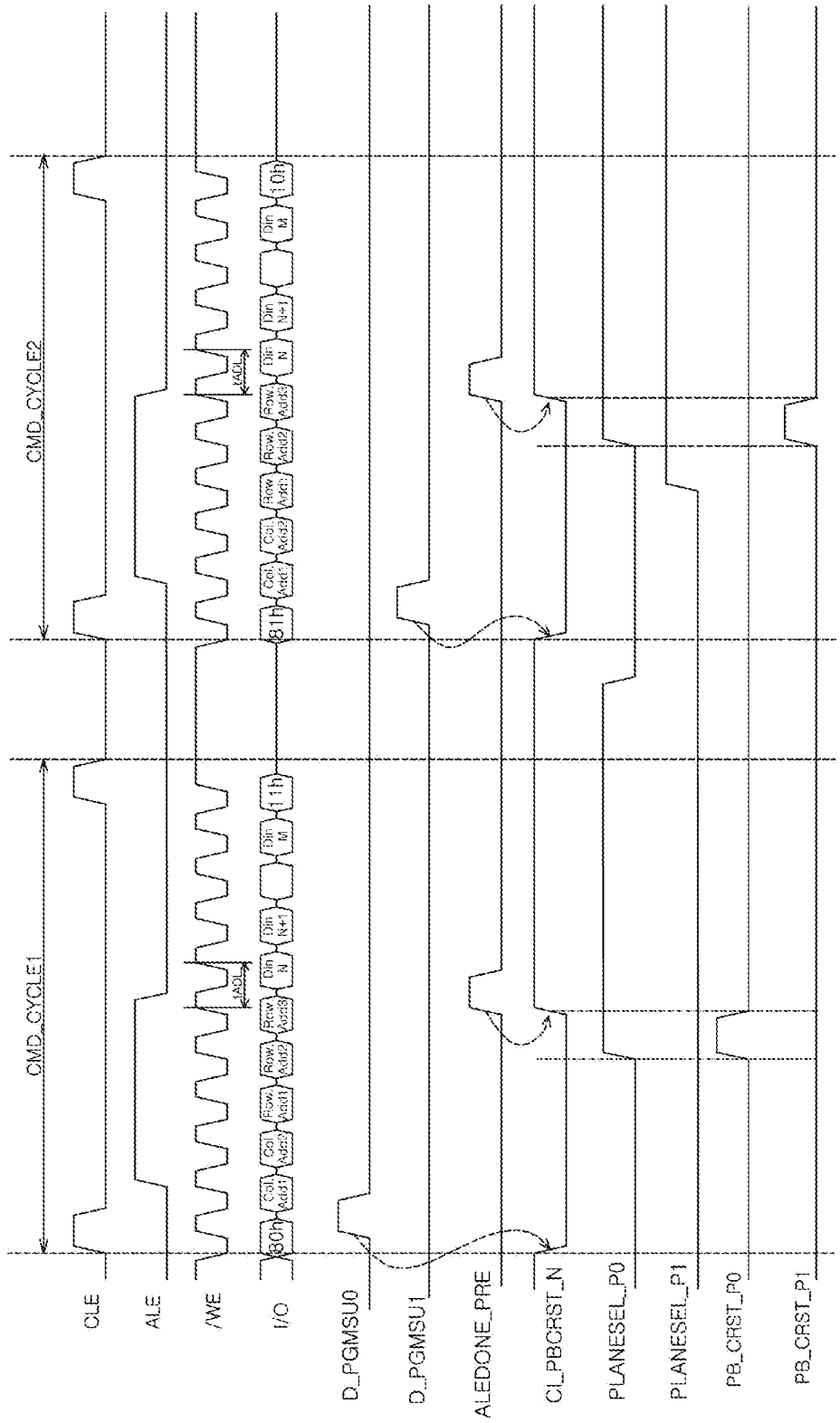

SEMICONDUCTOR MEMORY APPARATUS AND METHOD FOR DRIVING THE SAME

CROSS-REFERENCES TO RELATED APPLICATION

The present application claims priority under 35 U.S.C. §119(a) to Korean Patent Application No. 10-2011-0028861, filed on Mar. 30, 2011, in the Korean Intellectual Property Office, which is incorporated herein by reference in its entirety as if set forth in full.

BACKGROUND

1. Technical Field

Various embodiments of the present invention relate to semiconductor memory apparatuses and related methods. In particular, certain embodiments relate to technology for resetting page buffers.

2. Related Art

A memory block of a semiconductor memory apparatus may be divided into a plurality of planes. Each of the planes may include a plurality of memory cell arrays and a plurality of page buffers. In general, the plurality of planes are sequentially enabled to perform a data input/output operation.

In order to program input data applied from outside in the memory block, the semiconductor memory apparatus performs an operation of setting the input data in a plurality of page buffers.

Meanwhile, before the input data are set in the plurality of page buffers, the page buffers should be reset. At this time, in the conventional semiconductor memory apparatus including the memory block divided into the plurality of planes, all the page buffers allocated to the respective planes are simultaneously reset.

Since all the page buffers allocated to the respective planes are simultaneously reset, excessive current consumption inevitably occurs.

SUMMARY

Accordingly, there is a need for a semiconductor memory apparatus and a method for driving the same, which are capable of resetting only page buffers allocated to a selected plane during each command cycle and thereby reducing current consumption caused by the resetting operation.

Also there is a need for a semiconductor memory apparatus and a method for driving the same, which are capable of outputting data of page buffers allocated to a plane which is not reset among a plurality of planes.

To attain the advantages and in accordance with the purposes of the invention, as embodied and broadly described herein, one exemplary aspect of the present invention may provide a semiconductor memory apparatus including: a memory block including first and second planes; and a reset signal generator configured to generate a first reset signal by logically combining a first plane selection signal and a control pulse signal which pulses after a first programming setup pulse signal pulses during a first programming command cycle, and generate a second reset signal by logically combining a second plane selection signal and the control pulse signal which again pulses after a second programming setup pulse signal pulses during a second programming command cycle after the first programming command cycle. A plurality of first page buffers allocated to the first plane are reset in response to the first reset signal, and a plurality of second page buffers allocated to the second plane are reset in response to the second reset signal.

In another exemplary aspect of the present invention, a semiconductor memory apparatus may include: a memory block including first and second planes; a command processor configured to decode a plurality of control signals and a command code, and output the decoded signals as a control pulse signal, a first programming setup pulse signal, and a second programming setup pulse signal; an address latch configured to latch an applied address and output the latched address as a row address, a column address, and first and second plane selection signals; and a reset signal generator configured to generate a first reset signal by logically combining the first plane signal and the control pulse signal which pulses after the first programming setup pulse signal pulses during a first command cycle and generate a second reset signal by logically combining the second plane signal and the control pulse signal which again pulses after the second programming setup pulse signal pulses during a second command cycle after the first command cycle. A plurality of page buffers allocated to the first plane are reset in response to the first reset signal, and a plurality of page buffers allocated to the second plane are reset in response to the second reset signal.

In another exemplary aspect of the present invention, a method for driving a semiconductor memory apparatus which includes a first plane storing first data and a second plane storing second data. The method may include: detecting the first data through a plurality of page buffers allocated to the first plane, storing the detection result, detecting the second data through a plurality of second page buffers allocated to the second plane, and storing the detection result; resetting the plurality of first page buffers and setting third data in the plurality of first page buffers, during a first programming command cycle; outputting the second data stored in the plurality of second page buffers; and resetting the plurality of second page buffers and setting fourth data in the plurality of second page buffers, during the second programming command cycle.

Additional objects and advantages of the invention will be set forth in part in the description which follows, and in part will be obvious from the description, or may be learned by practice of the invention. The objects and advantages of the invention will be realized and attained by means of the elements and combinations particularly pointed out in the appended claims.

It is to be understood that both the foregoing general description and the following detailed description are exemplary and explanatory only and are not restrictive of the invention, as claimed.

BRIEF DESCRIPTION OF THE DRAWINGS

The accompanying drawings, which are incorporated in and constitute a part of this specification, illustrate various embodiments consistent with the invention and, together with the description, serve to explain the principles of the invention.

FIG. 3 is a timing diagram showing a main internal operation of the semiconductor memory apparatus of FIG. 1.

DETAILED DESCRIPTION

Figure 1:
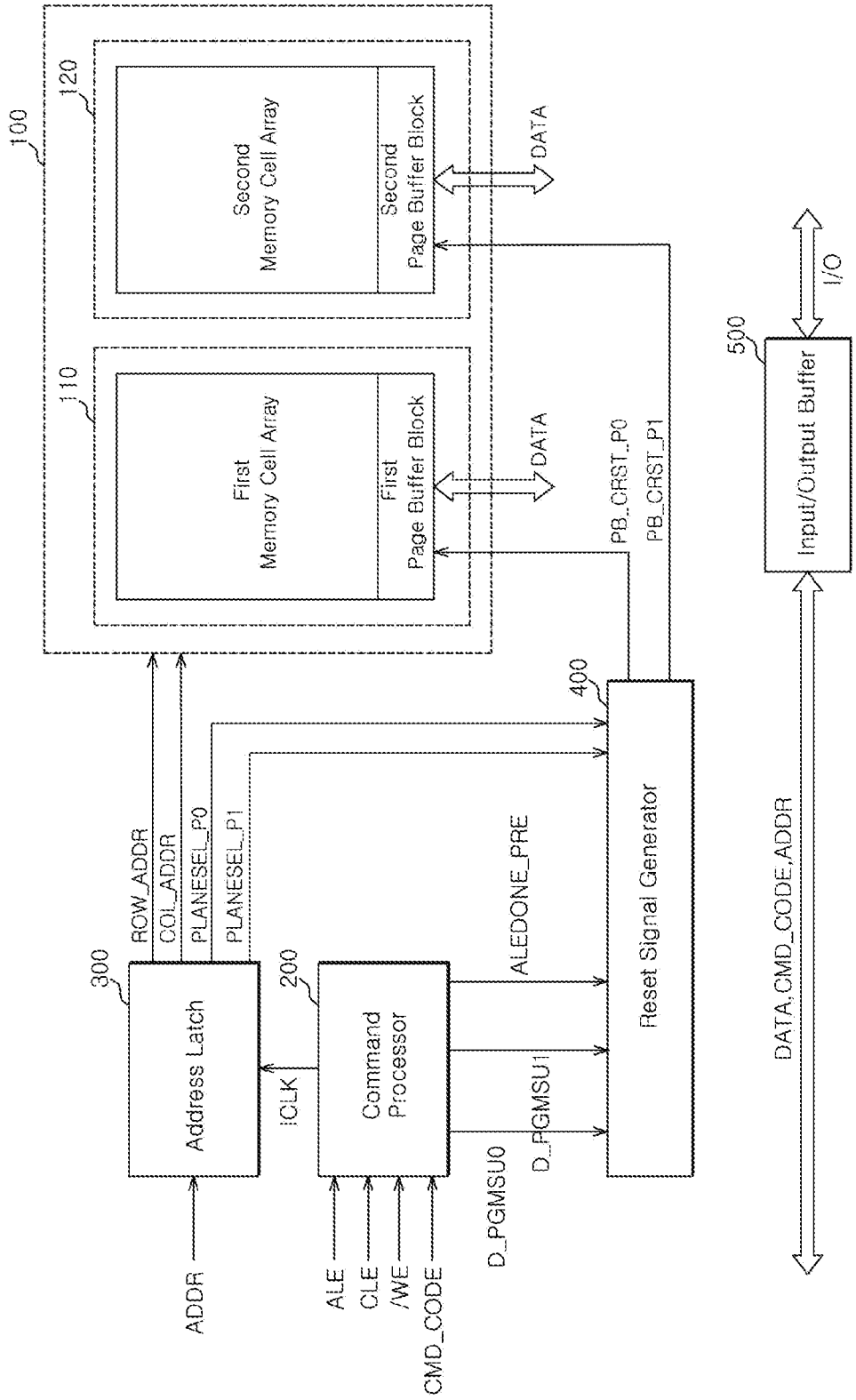
FIG. 1 is a configuration diagram of a semiconductor memory apparatus according to one exemplary embodiment of the invention.

Reference will now be made in detail to the exemplary embodiments consistent with the present disclosure, examples of which are illustrated in the accompanying drawings. Wherever possible, the same reference characters will be used throughout the drawings to refer to the same or like parts.

FIG. 1 is a configuration diagram of a semiconductor memory apparatus according to one exemplary embodiment of the invention.

The semiconductor memory apparatus according to the exemplary embodiment of the invention includes only components for clearly explaining the technical idea of the present invention.

Referring to FIG. 1, the semiconductor memory apparatus may include a memory block 100, a command processor 200, an address latch 300, a reset signal generator 400, and an input/output buffer 500.

In this exemplary embodiment, the memory block 100 may be divided into a plurality of planes, that is, first and second planes 110 and 120, for example. The first plane 110 may include a plurality of first memory cell arrays and a first page buffer block, and the second plane 120 may include a plurality of second memory cell arrays and a second page buffer block. Each of the memory cell arrays may include a plurality of nonvolatile memory cells. In this exemplary embodiment, it is assumed that the nonvolatile memory cell is a flash memory cell.

Since the first and second page buffer blocks are configured in the same manner, the configuration of the first page buffer block will be representatively described as follows. The first page buffer block may include a plurality of first page buffers which are configured to detect data stored in a selected first memory cell array and latch the detection result. Furthermore, the plurality of first page buffers program set input data in the selected first memory cell array.

The detailed configuration and main operations of the semiconductor memory apparatus configured in the above-described manner will be described as follows.

The input/output buffer 500 is configured to buffer an external address and an external command code which are transferred through an external interface channel I/O during each command cycle, and output the buffered signals as an address ADDR and a command code CMD_CODE. Furthermore, the input/output buffer 500 is configured to buffer external input data transferred through the external interface channel I/O during each command cycle and provide the buffered data to the memory block 100, or configured to output data outputted from the memory block 100 through the external interface channel I/O.

The command processor 200 is configured to decode a plurality of control signals ALE, CLE, and /WE and the command code CMD_CODE and output the decoded signals as a control pulse signal ALEDONE_PRE, a first programming setup pulse signal D_PGMSU0, and a second programming setup pulse signal D_PGMSU1.

In this exemplary embodiment, the plurality of control signals ALE, CLE, and /WE include an address latch enable signal ALE, a command latch enable signal CLE, and a write enable signal /WE. The write enable signal /WE is used as an internal clock signal ICLK for latching the address ADDR when the address latch enable signal ALE is activated at a high level.

When the command latch enable signal CLE is activated to a high level, the command processor 200 decodes the command code CMD_CODE in response to the write enable signal /WE and outputs the decoded signal as the first programming setup pulse signal D_PGMSU0 or the second programming setup pulse signal D_PGMSU1.

The address latch 300 is configured to latch the applied address ADDR and output the latched signal as a row address ROW_ADDR, a column address COL_ADDR, a first plane selection signal PLANESEL_P0, and a second plane selection signal PLANESEL_P1, in response to an internal clock signal. For reference, the row address ADDR may include the first plane selection signal PLANESEL_P0 and the second plane selection signal PLANESEL_P1.

In this exemplary embodiment, the control pulse signal ALEDONE_PRE is a signal indicating that the row address ROW_ADDR, the column address COL_ADDR, the first plane selection signal PLANESEL_P0, and the second plane selection signal PLANESEL_P1 are all latched. When all the above-described signals are latched, the control pulse signal ALEDONE_PRE pulses to a high level. Depending on embodiments, the control pulse signal ALEDONE_PRE may pulse to a high level at a time point when a specific address is inputted or the last address is applied.

The reset signal generator 400 is configured to logically combine the first plane selection signal PLANESEL_P0 and the control pulse signal ALEDONE_PRE which pulses to a high level after the first programming setup pulse signal D_PGMSU0 pulses to a high level, and generate a first reset signal PB_CRST_P0, during a first command cycle. Here, the first command cycle means a first programming command cycle.

Furthermore, the reset signal generator 400 is configured to logically combine the second plane selection signal PLANESEL_P1 and the control pulse signal ALEDONE_PRE which again pulses at a high level after the second programming setup pulse signal D_PGMSU1 pulses to a high level, and generate a second reset signal PB_CRST_P1, during a second command cycle after the first command cycle. Here, the second command cycle means a second programming command cycle.

Figure 2:
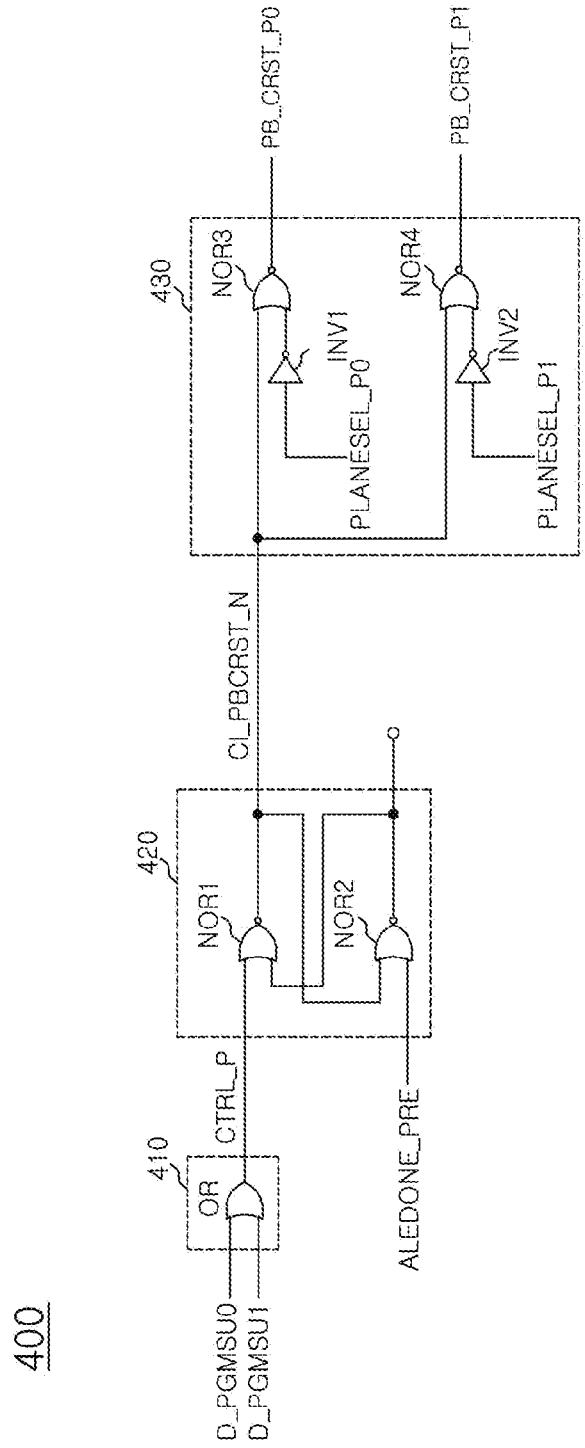
FIG. 2 is a circuit diagram of a reset signal generator of FIG. 1.

FIG. 2 is a circuit diagram of the reset signal generator of FIG. 1.

Referring to FIG. 2, the reset signal generator 400 includes an output pulse signal output unit 410, a section control signal output unit 420, and a reset signal output unit 430.

When any one of the first and second programming setup pulse signals D_PGMSU0 and D_PGMSU1 pulses to a high level, the output pulse signal output unit 410 outputs an output pulse signal CTRL_P which pulses to a high level in correspondence to the pulsing signal. In this exemplary embodiment, the output pulse signal output unit 410 includes a logic section OR configured to receive the first and second programming setup pulse signals D_PGMSU0 and D_PGMSU1 and output the output pulse signal CTRL_P.

The section control signal output unit 420 is configured to output a section control signal CI_PBCRST_N which is activated to a low level when the output pulse signal CTRL_P is activated to a high level and deactivated to a high level when the control pulse signal ALEDONE_PRE is activated to a high level. In this exemplary embodiment, the section control signal output unit 420 includes RS latch sections NOR1 and NOR2 configured to receive the output pulse signal CTRL_P and the control pulse signal ALEDONE_PRE and output the section control signal CI_PBCRST_N.

The reset signal output unit 430 is configured to logically combine the first plane selection signal PLANESEL_P0 and the section control signal CI_PBCRST_N and output the combined signal as a first reset signal PB_CRST_P0. Furthermore, the reset signal output unit 430 is configured to logically combine the second plane selection signal PLANESEL_P1 and the section control signal CI_PBCRST_N and output the combined signal as a second reset signal PB_CRST_P1. In this exemplary embodiment, the reset signal output unit 430 includes a first logic section NOR3 and INV1 and a second logic section NOR4 and INV2. The first logic section NOR3 and INV1 is configured to receive the first plane selection signal PLANESEL_P0 and the section control signal CI_PBCRST_N and output the first reset signal PB_CRST_P0. The second logic section NOR4 and INV2 is configured to receive the second plane selection signal PLANESEL_P1 and the section control signal CI_PBCRST_N and output the second reset signal PB_CRST_P1. Therefore, the first reset signal PB_CRST_P0 is activated to a high level, when the section control signal CI_PBCRST_N is at a low level and the first plane selection signal PLANESEL_P0 is at a high level. Furthermore, the second reset signal PB_CRST_P1 is activated to a high level, when the section control signal CI_PBCRST_N is at a low level and the second plane selection signal PLANESEL_P1 is at a high level.

Meanwhile, in this exemplary embodiment, the plurality of first page buffers allocated to the first plane 110 are reset in response to the first reset signal PB_CRST_P0, and the plurality of second page buffers allocated to the second plane 120 are reset in response to the second reset signal PB_CRST_P1. Therefore, the plurality of first page buffers are reset during the first programming command cycle, and the plurality of second page buffers are reset during the second programming command cycle.

FIG. 3 is a timing diagram showing the main internal operation of the semiconductor memory apparatus of FIG. 1.

Referring to the timing diagram of FIG. 3, the main operation of the semiconductor memory apparatus configured in the above-described manner will be described as follows.

The input/output buffer 500 buffers a first external address and a first external command code which are applied through the external interface channel I/O during the first programming command cycle CMD_CYCLE1, and outputs the buffered signals as a first address ADDR and a first programming setup command 80h.

Furthermore, the input/output buffer 500 buffers a second external address and a second external command code which are applied through the external interface channel I/O during the second programming command cycle CMD_CYCLE2, and outputs the buffered signals as a second address ADDR and a second programming setup command 81h.

Furthermore, the input/output buffer 500 buffers external input data transferred through the external interface channel I/O during the first and second programming command cycles CMD_CYCLE1 and CMD_CYCLE2 and provides the buffered data to the memory block 100, or outputs data outputted from the memory block 100 through the external interface channel I/O.

That is, the first programming setup command 80h, the first address ADDR, first data Din, and a first termination command 11h are sequentially applied during the first programming command cycle CMD_CYCLE1.

Furthermore, the second programming setup command 81h, the second address ADDR, second data Din, and a second termination command 10h are sequentially applied during the second programming command cycle CMD_CYCLE2.

The command programming unit 200 decodes the plurality of control signals ALE, CLE, and /WE, and the first and second programming setup commands 80h and 81h which are sequentially applied, and outputs the decoded signals as the control pulse signal ALEDONE_PRE, the first programming setup pulse signal D_PGMSU0, and the second programming setup pulse signal D_PGMSU1.

The plurality of control signals ALE, CLE, and /WE include the address latch enable signal ALE, the command latch enable signal CLE, and the write enable signal /WE. In this exemplary embodiment, the write enable signal /WE is used as an internal clock signal ICLK for latching the first and second addresses, when the address latch enable signal ALE is activated to a high level.

The command processor 200 decodes the first or second programming setup command 80h or 81h in response to the write enable signal /WE and outputs the decoded signal as the first or second programming setup pulse signal D_PGMSU0 or D_PGMSU1, when the command latch enable signal CLE is activated to a high level.

That is, the command processor 200 decodes the first programming setup command 80h in response to the write enable signal /WE and activates the first programming setup pulse signal D_PGMSU0 to a high level, when the command latch enable signal CLE is activated at a high level, during the first programming command cycle CMD_CYCLE1.

Furthermore, the command processor 200 decodes the second programming setup command 81 in response to the write enable signal /WE and activates the second programming setup pulse signal D_PGMSU1 to a high level, when the command latch enable signal CLE is activated to a high level, during the second programming command cycle CMD_CYCLE2.

The address latch 300 latches the first address ADDR and outputs the latched address as the first row address ROW_ADDR, the first column address COL_ADDR, and the first plane selection signal PLANESEL_P0, during the first programming command cycle CMD_CYCLE1.

Furthermore, the address latch 300 latches the second address ADDR and outputs the latched address as the second row address ROW_ADDR, the second column address COL_ADDR, and the second plane selection signal PLANESEL_P1, during the second programming command cycle CMD_CYCLE2.

Now, the main operation during the first programming command cycle CMD_CYCLE1 will be described as follows.

First, when the first programming setup command 80h is applied, the first programming setup pulse signal D_PGMSU0 pulses to a high level. Therefore, the section control signal CI_PBCRST_N is activated to a high level.

Next, the column address COL_ADDR, the row address ROW_ADDR, and the data Din are sequentially inputted. When the last portion of the row address is inputted, the control pulse signal ALEDONE_PRE pulses to a high level. Therefore, the section control signal CI_PRCRST_N is deactivated to a high level.

At this time, since the first plane selection signal PLANESEL_P0 is contained in the row address ROW_ADDR, the first plane selection signal PLANESEL_P0 is activated to a high level. As a result, when the first plane selection signal PLANESEL_P0 is activated to a high level, the first reset signal PB_CRST_P0 is activated to a high level. That is, when the first reset signal PB_CRST_P0 is activated, the plurality of first page buffers allocated to the first plane 110 are reset.

Finally, as a first termination command 11h is applied, the first programming command cycle is terminated.

Now, the main operation during the second programming command cycle CMD_CYCLE2 will be described as follows.

First, when the second programming setup command 81h is applied, the second programming setup pulse signal D_PGMSU1 pulses to a high level. Therefore, the section control signal CI_PBCRST_N is activated to a low level.

Next, the column address COL_ADDR, the row address ROW_ADDR, and the data Din are sequentially inputted. When the last portion of the row address ROW_ADDR is inputted, the control pulse signal ALEDONE_PRE pulses to a high level. Therefore, the section control signal CI_PR-CRST_N is deactivated to a high level.

At this time, since the second plane selection signal PLANESEL_P1 is contained in the row address ROW_ADDR, the second plane selection signal PLANESEL_P1 is activated to a high level. As a result, when the second plane selection signal PLANESEL_P1 is activated to a high level, the second reset signal PB_CRST_P1 is activated to a high level. That is, when a second reset signal PB_CRST_P1 is activated, the plurality of second page buffers allocated to the second plane 120 are reset.

Finally, as the second termination command 10h is applied, the second programming command cycle CMD_CYCLE2 is terminated.

Meanwhile, the semiconductor memory apparatus according to the exemplary embodiment may be driven through the following method. The method may include: detecting first data through a plurality of first page buffers allocated to a first plane, storing the detection result, detecting second data through a plurality of second page buffers allocated to a second plane, and storing the detection result; resetting the plurality of first page buffers and setting third data in the plurality of page buffers during a first programming command cycle; outputting the second data stored in the plurality of second page buffers; and resetting the plurality of second page buffers and setting fourth data in the plurality of second page buffers during a second programming command cycle. That is, in the semiconductor memory apparatus driving in such a manner, the plurality of first page buffers allocated to the first plane and the plurality of second page buffers allocated to the second plane are independently reset during the respective programming command cycles. Therefore, since the plurality of second page buffers allocated to the second plane maintain the detected data even after the first programming command cycle, the stored data may be outputted whenever necessary.

In short, since only page buffers allocated to a selected plane may be reset during each command cycle through the semiconductor memory apparatus and the method for driving the same according to the embodiments of the present invention, it is possible to reduce current consumption which occurs during resetting.

While certain embodiments have been described above, it will be understood to those skilled in the art that the embodiments described are by way of example only. Accordingly, the semiconductor memory apparatus described herein should not be limited based on the described embodiments. Rather, the semiconductor memory apparatus described herein should only be limited in light of the claims that follow when taken in conjunction with the above description and accompanying drawings.

What is claimed is:

1. A semiconductor memory apparatus comprising:
    a memory block including first and second planes; and
    a reset signal generator configured to generate a first reset signal by logically combining a first plane selection signal and a control pulse signal which pulses after a first programming setup pulse signal pulses during a first programming command cycle, and generate a second reset signal by logically combining a second plane selection signal and the control pulse signal which again pulses after a second programming setup pulse signal pulses during a second programming command cycle after the first programming command cycle,
    wherein a plurality of first page buffers allocated to the first plane are reset in response to the first reset signal, and a plurality of second page buffers allocated to the second plane are reset in response to the second reset signal, and
    wherein the reset signal generator comprises:
    an output pulse signal output unit configured to output an output pulse signal which pulses to a high level when any one of the first and second programming setup pulse signals pulses to a high level;
    a section control signal output unit configured to output a section control signal which is activated when the output pulse signal is activated and deactivated when the control pulse signal is activated; and
    a reset signal output unit configured to logically combine the first plane selection signal and the section control signal to output as the first reset signal and logically combine the second plane selection signal and the section control signal to output as the second reset signal.

2. The semiconductor memory apparatus according to claim 1, wherein the reset signal generator generates the first reset signal by logically combining the first plane selection signal contained in a first address and the control pulse signal which pulses when the first address is completely applied, during the first programming command cycle in which a first programming setup command, the first address, first data, and a first termination command are sequentially applied, and generates the second reset signal by logically combining the second plane section signal contained in a second address and the control pulse signal which again pulses when the second address is completely applied, during the second programming command cycle in which a second programming setup command, the second address, second data, and a second termination command are sequentially applied.

3. The semiconductor memory apparatus according to claim 2, further comprising:
    a command processor configured to decode a plurality of control signals and the first and second programming setup commands which are sequentially applied, and output the decoded signals as the control pulse signal, the first programming setup pulse signal, and the second programming setup pulse signal; and
    an address latch configured to latch the first and second addresses and output the latched signals as first and second row addresses, first and second column addresses, and the first and second plane selection signals, respectively.

4. The semiconductor memory apparatus according to claim 3, further comprising an input/output buffer configured to buffer a first external address and a first external command code to output as the first address and the first programming setup command during the first programming command cycle, and buffer a second external address and a second external command code to output as the second address and the second programming setup command during the second programming command cycle.

5. The semiconductor memory apparatus according to claim 3, further comprising an input/output buffer configured to buffer a first external address and a first external command code to output as the first address and the first programming setup command during the first programming command cycle, buffer a second external address and a second external command code to output as the second address and the second programming setup command during the second programming command cycle, and buffer external input data to provide to the memory block or output data outputted from the memory block to the outside during the first and second programming command cycles.

6. The semiconductor memory apparatus according to claim 3, wherein the plurality of control signals comprise an address latch enable signal, a command latch enable signal, and a write enable signal, and the write enable signal is used as an internal clock signal for latching the first and second addresses, when the address latch enable signal is activated.

7. The semiconductor memory apparatus according to claim 6, wherein the command processor decodes the first or second programming setup command in response to the write enable signal and outputs the decoded signal as the first or second programming setup pulse signal, when the command latch enable signal is activated.

8. The semiconductor memory apparatus according to claim 1, wherein each of the first and second planes comprises a plurality of nonvolatile memory cells.

9. A semiconductor memory apparatus comprising:
a memory block comprising first and second planes;
a command processor configured to decode a plurality of control signals and a command code, and output the decoded signals as a control pulse signal, a first programming setup pulse signal, and a second programming setup pulse signal;
an address latch configured to latch an applied address and output the latched address as a row address, a column address, and first and second plane selection signals; and
a reset signal generator configured to generate a first reset signal by logically combining the first plane selection signal and the control pulse signal which pulses after the first programming setup pulse signal pulses during a first command cycle and generate a second reset signal by logically combining the second plane selection signal and the control pulse signal which again pulses after the second programming setup pulse signal pulses during a second command cycle after the first command cycle,
wherein a plurality of page buffers allocated to the first plane are reset in response to the first reset signal, and a plurality of page buffers allocated to the second plane are reset in response to the second reset signal, and
wherein the reset signal generator comprises:
an output pulse signal output unit configured to output an output pulse signal which pulses to a high level when any one of the first and second programming setup pulse signals pulses to a high level;
a section control signal output unit configured to output a section control signal which is activated when the output pulse signal is activated and deactivated when the control pulse signal is activated; and
a reset signal output unit configured to output the first reset signal by logically combining the first plane selection signal and the section control signal and output the second reset signal by logically combining the second plane selection signal and the section control signal.

10. The semiconductor memory apparatus according to claim 9, further comprising an input/output buffer configured to buffer an external address and an external command code and output the buffered signals as the address and the command code, during each of the first and second command cycles.

11. The semiconductor memory apparatus according to claim 9, further comprising an input/output buffer configured to buffer an external address and an external command code to output as the address and the command code during each of the first and second command cycles, and buffer external input data to provide to the memory block or output data outputted from the memory block to the outside during each of the first and second command cycles.

12. The semiconductor memory apparatus according to claim 9, wherein the row address comprises the first and second plane selection signals.

13. The semiconductor memory apparatus according to claim 9, wherein the control pulse signal comprises a signal indicating that the row address, the column address, and the first and second plane selection signals are all latched.

14. The semiconductor memory apparatus according to claim 9, wherein the plurality of control signals comprise an address latch enable signal, a command latch enable signal, and a write enable signal, and the write enable signal is used as an internal clock signal for latching the address when the address latch enable signal is activated.

15. The semiconductor memory apparatus according to claim 14, wherein the command processor decodes the command code in response to the write enable signal and outputs the decoded signal as the first or second programming setup pulse signal, when the command latch enable signal is activated.

16. The semiconductor memory apparatus according to claim 9, wherein each of the first and second planes comprises a plurality of nonvolatile memory cells.

* * * * *